US007907036B2

(12) United States Patent
Hiroshima et al.

(10) Patent No.: US 7,907,036 B2
(45) Date of Patent: Mar. 15, 2011

(54) MICROSTRIPLINE FILTER AND METHOD FOR MANUFACTURING THE SAME

(75) Inventors: Motoharu Hiroshima, Nomi (JP); Soichi Nakamura, Omihachiman (JP); Yasunori Takei, Komatsu (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 23 days.

(21) Appl. No.: 12/539,678

(22) Filed: Aug. 12, 2009

(65) Prior Publication Data

US 2009/0302975 A1 Dec. 10, 2009

Related U.S. Application Data

(63) Continuation of application No. PCT/JP2008/059429, filed on May 22, 2008.

(30) Foreign Application Priority Data

Jul. 13, 2007 (JP) ................................ 2007-183825

(51) Int. Cl.
*H01P 1/203* (2006.01)
*H01P 7/08* (2006.01)
*H05K 3/00* (2006.01)

(52) U.S. Cl. ............................ 333/204; 333/219; 29/829

(58) Field of Classification Search .................. 333/166, 333/167, 175, 176, 185, 202, 204, 205
See application file for complete search history.

(56) References Cited

U.S. PATENT DOCUMENTS 5,521,564 A * 5/1996 Kaneko et al. ................ 333/175

FOREIGN PATENT DOCUMENTS

| | | |
|---|---|---|
| JP | 56-105902 | 8/1981 |
| JP | 10-065401 | 3/1998 |
| JP | 2006-270508 | 10/2006 |
| JP | 2007-180684 | 7/2007 |

* cited by examiner

*Primary Examiner* — Benny Lee
*Assistant Examiner* — Gerald Stevens
(74) *Attorney, Agent, or Firm* — Dickstein Shapiro LLP

(57) ABSTRACT

A microstripline filter in which characteristics of a plurality of resonators which are connected to one another in a manner of inductive coupling are precisely set. The microstripline filter includes a ground electrode, main-surface lines, common electrodes, short-circuit electrodes, and input/output electrodes. The ground electrode is arranged on a lower surface of a dielectric substrate having a rectangular plate shape. The plurality of main-surface lines are arranged on an upper surface of the dielectric substrate and form respective resonators. The common electrodes connect some of the main-surface lines to one another in conduction states. The plurality of short-circuit electrodes connect a group of the main-surface lines which are brought to conduction states by the common electrodes to the ground electrode through an identical side surface of the dielectric substrate. The input-and-output electrodes are connected to corresponding ones of the resonators including the main-surface lines.

10 Claims, 5 Drawing Sheets

MICROSTRIPLINE FILTER AND METHOD FOR MANUFACTURING THE SAME

CROSS REFERENCE TO RELATED APPLICATIONS

The present application is a continuation of International Application No. PCT/JP2008/059429, filed May 22, 2008, which claims priority to Japanese Patent Application No. JP2007-183825, filed Jul. 13, 2007, the entire contents of each of these applications being incorporated herein by reference in their entirety.

FIELD OF THE INVENTION

The present invention relates to a microstripline filter in which striplines are arranged in a dielectric substrate, and a method for manufacturing the same.

BACKGROUND OF THE INVENTION

In general, microstripline filters in which striplines included in quarter-wavelength resonators are arranged so that open ends thereof are directed to a certain direction and the adjacent resonators are comb-line coupled with one another are used. In such a comb-line microstripline filter, a common electrode may be arranged so as to connect ends of a plurality of resonator lines on short-circuit sides with one another, and the resonators may be inductively coupled with one another (Refer to Patent Documents 1 and 2).

A microstripline filter according to Patent Document 1 includes a common electrode perpendicularly extending relative to striplines. First ends of all the striplines are commonly connected to the common electrode. Both ends of the common electrode are connected to a ground electrode in both surfaces which are parallel to the striplines.

FIG. 1 is a diagram illustrating an example of a configuration of a microstripline filter according to Patent Document 2. In a microstripline filter 101, striplines 102A to 102C are commonly connected to a common electrode 103 at first ends thereof. Furthermore, the common electrode 103 is connected to a short-circuit electrode 104. The short-circuit electrode 104 extends in parallel to the striplines 102A to 102C and is grounded in a ground electrode 105.

[Patent Document 1] Japanese Unexamined Utility Model Application Publication No. 56-105902

[Patent Document 2] Japanese Unexamined Patent Application Publication No. 2006-270508

SUMMARY OF THE INVENTION

In known filters, resonant frequencies of resonators and coupling coefficients among the resonators are set by controlling line lengths and line widths of striplines, gaps among adjacent striplines, a line width of a common electrode, and a line width of a short-circuit electrode. However, even if forms of the electrodes are thus controlled, due to restriction of configurations of the electrodes, it is not necessarily the case that desired resonant frequencies and desired coupling coefficients can be realized. Therefore, a desired frequency characteristic is not obtained.

Accordingly, the present invention provides a microstripline filter capable of enhancing a degree of freedom of setting of resonant frequencies of resonators and setting of coupling coefficients among the resonators and precisely controlling the setting of the resonant frequencies of the resonators and setting of the coupling coefficients among the resonators.

A microstripline filter according to this invention includes a ground electrode, a plurality of main-surface lines, common electrodes, a plurality of short-circuit electrodes, and input/output electrodes. The ground electrode is arranged on a lower surface of a dielectric substrate having a rectangular plate shape. The plurality of main-surface lines are arranged on an upper surface of the dielectric substrate and are included in respective resonators. The common electrodes connect some of the main-surface lines to one another in conduction states. The plurality of short-circuit electrodes connect a group of the main-surface lines which are brought to conduction states by the common electrodes to the ground electrode through an identical side surface of the dielectric substrate. The input-and-output electrodes are connected to corresponding ones of the resonators.

With this configuration, characteristics of the resonators including the main-surface lines connected to the common electrodes and degree of coupling can be controlled by controlling electrode patterns of the plurality of short-circuit electrodes connected to a pair of the common electrodes, that is, by controlling line widths of the short-circuit electrodes, positions where the common electrodes and the short-circuit electrodes are connected, or gaps between the adjacent short-circuit electrodes. Accordingly, resonant frequencies of the resonators and coupling coefficients among the adjacent resonators can be set in high degree of freedom. Since the coupling coefficients and the resonant frequencies in a case where shapes of the short-circuit electrodes are changed are less affected when compared with a case where shapes of the common electrodes and the main-surface lines are changed, the resonant frequencies of the resonators and the coupling coefficients among the resonators can be accurately controlled.

The short-circuit electrodes are individually arranged on portions of the common electrodes where pairs of the adjacent main-surface lines are connected to each other.

With this configuration, in three resonators including respective three main-surface lines adjacent to one another, degrees coupling among the resonators are determined in accordance with arrangement of two short-circuit electrodes.

Mass production of the microstripline filter in which the resonant frequencies of the resonator and the coupling coefficients among the resonators are accurately controlled is realized by controlling the plurality of short-circuit electrodes which are connected to one another in conduction states through the common electrodes.

According to the present invention, resonant frequencies and coupling coefficients of a plurality of resonators which are connected to one another in a comb-line coupling are determined by electrode patterns of a plurality of short-circuit electrodes connected to identical common electrodes, and the coupling coefficients are accurately set. Since the setting of the short-circuit electrodes is performed separately from setting of plurality of main-surface lines connected to the common electrodes, a frequency characteristic is easily set and the electrode patterns are easily designed.

REFERENCE NUMERALS

Figure 1:
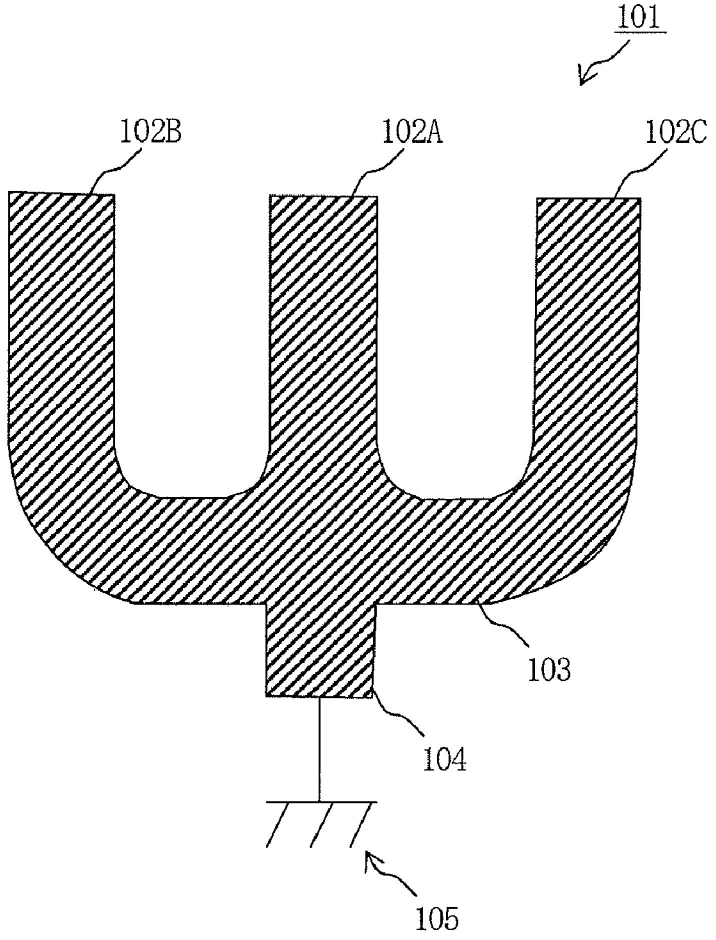
FIG. 1 PRIOR ART
FIG. 1 is a diagram illustrating an example of a known microstripline filter.

1 microstripline filter
2A to 2E main surface line
3A, 3B common electrode
4A to 4D side-surface short-circuit electrode
5 ground electrode
6A, 6B side-surface extraction electrode
7A, 7B input/output electrode
8A, 8B extraction electrode
10 dielectric substrate
60 glass layer
61 coupling electrode

DETAILED DESCRIPTION OF THE INVENTION

An example of a configuration of a microstripline filter will be described hereinafter.

The microstripline filter described herein corresponding to a bandpass filter. This filter is used in UWB (Ultra Wide Band) communications in a range from 3 GHz to 5 GHz.

Figure 2A:
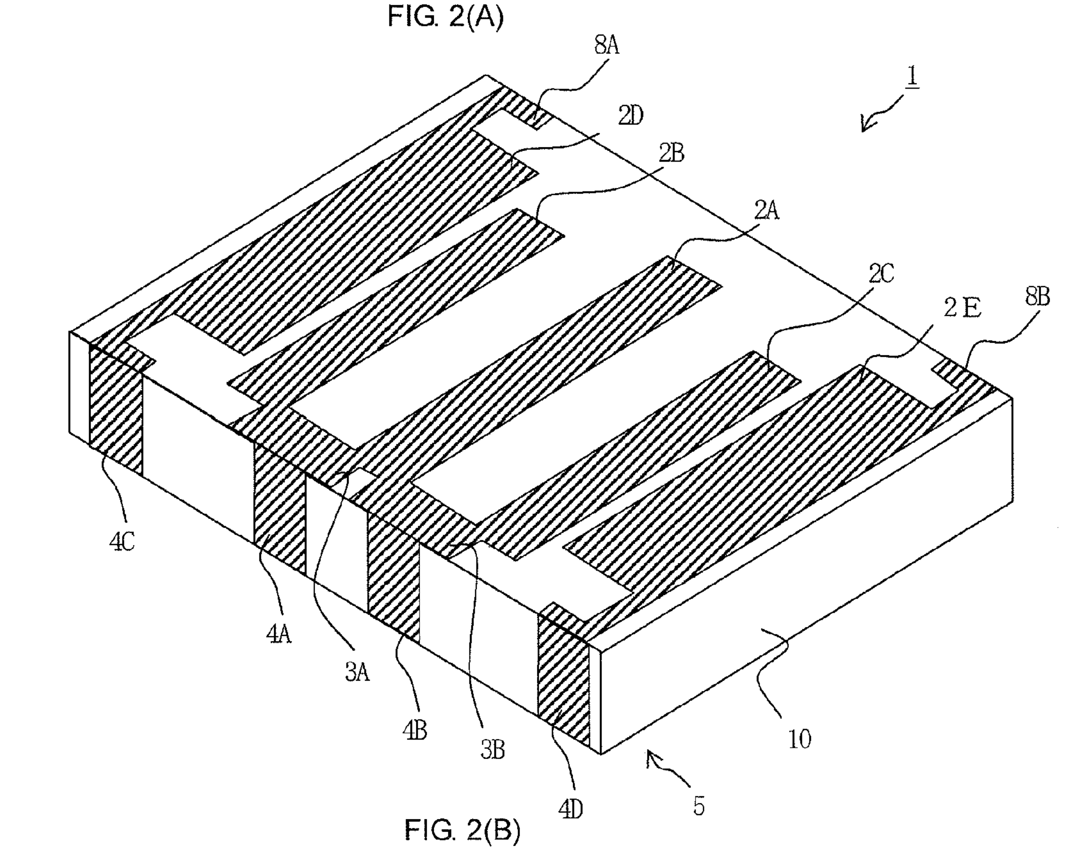
FIGS. 2A and 2B are perspective views illustrating an example of a configuration of a microstripline filter.
Figure 2B:
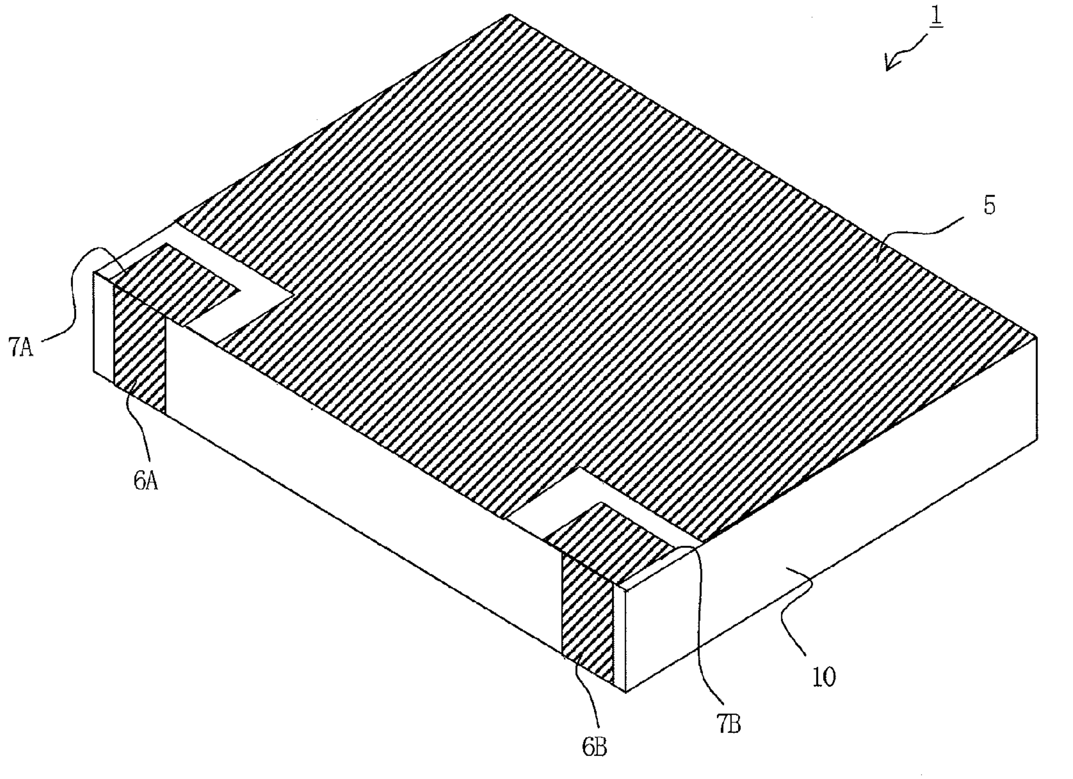

FIG. 2A is a perspective view illustrating a dielectric substrate, viewed from an upper surface thereof, included in the microstripline filter, and FIG. 2B is a perspective view illustrating the dielectric substrate viewed from a lower surface thereof.

A microstripline filter 1 includes a dielectric substrate 10 and a glass layer (not shown). Note that the glass layer is disposed on the upper surface of the dielectric substrate 10 so as to enhance environment resistance of the microstripline filter.

The substrate 10 is a sintered ceramic substrate of a small cube shape having a specific inductive capacity of approximately 111, and the substrate 10 is formed of titanium oxide or the like. Composition and a size of the substrate 10 are appropriately determined taking a frequency characteristic, for example, into consideration.

On the upper surface of the substrate 10, an upper-surface electrode pattern including main-surface lines 2A to 2E, common electrodes 3A and 3B, and extraction electrodes 8A and 8B are arranged. The upper-surface electrode pattern is formed of a silver electrode having a thickness of 6 μm or more. The upper-surface electrode pattern is formed by applying a photosensitive silver paste on the substrate 10, patterning the substrate 10 by a photolithography processing, and performing sintering.

The substrate 10 has a side-surface electrode pattern including side-surface short-circuit electrodes 4A to 4D on a front surface thereof. Furthermore, the substrate 10 has a side-surface electrode pattern including side-surface extraction electrodes 6A and 6B on a rear surface thereof. These side-surface electrode patterns are formed of silver electrodes having thicknesses of 12 μm or more. These side-surface electrode patterns are formed by applying a nonphotosensitive silver paste on the front and rear surfaces of the substrate 10 using a screen mask or a metal mask, and performing sintering.

The lower surface of the substrate 10 corresponds to an implementing surface of the microstripline filter 1. A lower-surface electrode pattern including a ground electrode 5 and input/output electrodes 7A and 7B are arranged on the lower surface of the substrate 10. The input/output electrodes 7A and 7B are formed so as to be separated from the ground electrode 5. The input/output electrodes 7A and 7B are connected to high-frequency-signal input/output terminals when the microstripline filter 1 is implemented on an implementing substrate. The ground electrode 5 serves as a ground surface of resonators, and is connected to a ground electrode of the implementing substrate. The lower-surface electrode pattern is formed of a silver electrode having a thickness of approximately 12 μm. The lower-surface electrode pattern is formed by applying a nonphotosensitive silver paste on the lower surface of the substrate 10 using a screen mask or a metal mask, and performing sintering.

Note that since the thicknesses of the electrodes of the side-surface electrode patterns are larger than those of the electrodes of the upper-surface electrode pattern, current supplied to portions on a ground terminal side on which current is generally concentrated is dispersed so that a conduction loss is reduced. With this configuration, the microstripline filter attains a small insertion loss.

Here, in the upper-surface electrode pattern, the main-surface lines 2A to 2E extend from a boundary between the front surface and the upper surface of the substrate 10 toward the rear surface of the substrate 10, and first ends of the main-surface lines 2A to 2E are opened. Furthermore, the main-surface lines 2A to 2E face the ground electrode 5 of the lower-surface electrode pattern. Accordingly, the main-surface lines 2A to 2E and the ground electrode 5 constitute resonators in five stages which are comb-line coupled with one another.

The extraction electrode 8A is arranged near the rear surface of the substrate 10. The extraction electrode 8A has one end which continues to the main-surface line 2D arranged on the upper surface of the substrate 10, and the other end which continues to the side-surface extraction electrode 6A arranged on the rear surface of the substrate 10. Note that the side-surface extraction electrode 6A continues to the input/output electrode 7A arranged on the lower surface of the substrate 10. Therefore, the extraction electrode 8A connects the resonator including the main-surface line 2D to the input/output electrode 7A through the side-surface extraction electrode 6A in a tap-coupling manner.

The main-surface line 2D has one end which continues to the extraction electrode 8A arranged on the upper surface of the substrate 10, and the other end which is connected to the side-surface short-circuit electrode 4C arranged on the front surface of the substrate 10. Note that the side-surface short-circuit electrode 4C continues to the ground electrode 5 arranged on the lower surface of the substrate 10. Therefore, the main-surface line 2D is connected to the ground electrode 5 through the side-surface short-circuit electrode 4C in a conduction state and constitutes a quarter-wavelength resonator in an input stage (or an output stage).

The main-surface line 2B has one end which is arranged on the upper surface and opened toward the rear surface of the substrate 10, and the other end which continues to the common electrode 3A arranged on the front surface side of the upper surface of the substrate 10. Note that the common electrode 3A continues to the side-surface short-circuit electrode 4A arranged on the front surface of the substrate 10, and the side-surface short-circuit electrode 4A continues to the ground electrode 5 on the lower surface of the substrate 10. Therefore, the main-surface line 2B is connected to the ground electrode 5 through the side-surface short-circuit electrode 4A in a conduction state, and constitutes a quarter-wavelength resonator in a second stage.

The center of the line width of the main-surface line 2D is shifted from the center of the line width of the side-surface short-circuit electrode 4C. The center of the line width of the main-surface line 2B is shifted from the center of the line width of the side-surface short-circuit electrode 4A. The main-surface line 2B is arranged close to the main-surface line 2D whereas the side-surface short-circuit electrode 4C is arranged far from the side-surface short-circuit electrode 4A. Therefore, the resonator in the input stage (or the output stage) including the main-surface line 2D is coupled with the resonator in the second stage including the main-surface line 2B in a manner of capacity coupling. Due to this capacity coupling, on a lower band side of the frequency characteristic of the microstripline filter 1, a first low-band attenuation pole falls.

The main-surface line 2A has one end which is arranged on the upper surface and opened toward the rear surface of the substrate 10, and the other end which continues to the common electrodes 3A and 3B arranged on the front surface side of the upper surface of the substrate 10. Note that the common electrode 3A continues to the side-surface short-circuit electrode 4A arranged on the front surface of the substrate 10, the common electrode 3B continues to the side-surface short-circuit electrode 4B arranged on the front surface of the substrate 10, and the side-surface short-circuit electrodes 4A and 4B continue to the ground electrode 5 arranged on the lower surface of the substrate 10. Therefore, the main-surface line 2A faces to the ground electrode 5 through the dielectric substrate 10, is connected to the ground electrode 5 through the side-surface short-circuit electrodes 4A to 4B in a conduction state, and constitutes a quarter-wavelength resonator in a third stage.

The main-surface lines 2A and 2B are connected to each other near a short-circuit end side through the common electrode 3A, and accordingly, enhanced inductive coupling is attained. Due to the inductive coupling, on a higher band side of the frequency characteristic of the microstripline filter 1, a first high-band attenuation pole falls.

The main-surface line 2C has one end which is arranged on the upper surface and opened toward the rear surface of the substrate 10, and the other end which continues to the common electrode 3B arranged on the front surface side of the upper surface of the substrate 10. Note that the common electrode 3B continues to the side-surface short-circuit electrode 4B arranged on the front surface of the substrate 10, and the side-surface short-circuit electrode 4B continues to the ground electrode 5 arranged on the lower surface of the substrate 10. Therefore, the main-surface line 2C is connected to the ground electrode 5 through the side-surface short-circuit electrode 4B in a conduction state, and constitutes a quarter-wavelength resonator in a fourth stage.

The main-surface lines 2A and 2C are connected to each other near a short-circuit end side through the common electrode 3B, and accordingly, enhanced inductive coupling is attained. Due to the inductive coupling, on a higher band side of the frequency characteristic of the microstripline filter 1, a second high-band attenuation pole falls.

The main-surface line 2E has one end which continues to the extraction electrode 8B arranged on the upper surface of the substrate 10, and the other end which is connected to the side-surface short-circuit electrode 4D arranged on the front surface of the substrate 10. Note that the side-surface short-circuit electrode 4D continues to the ground electrode 5 arranged on the lower surface of the substrate 10. Therefore, the main-surface line 2E is connected to the ground electrode 5 through the side-surface short-circuit electrode 4D in a conduction state and constitutes a quarter-wavelength resonator in an output stage (or an input stage).

The center of the line width of the main-surface line 2E is shifted from the center of the line width of the side-surface short-circuit electrode 4D. The center of the line width of the main-surface line 2C is shifted from the center of the line width of the side-surface short-circuit electrode 4B. The main-surface line 2E is arranged close to the main-surface line 2C whereas the side-surface short-circuit electrode 4B is arranged far from the side-surface short-circuit electrode 4D. Therefore, the resonator in the output stage (or the input stage) including the main-surface line 2E is coupled with the resonator in the fourth stage including the main-surface line 2C in a manner of capacity coupling. Due to this capacity coupling, on a lower band side of the frequency characteristic of the microstripline filter 1, a second low-band attenuation pole falls.

The extraction electrode 8B is arranged near the rear surface of the substrate 10. The extraction electrode 8B has one end which continues to the main-surface line 2E arranged on the upper surface of the substrate 10, and the other end which continues to the side-surface extraction electrode 6B arranged on the rear surface of the substrate 10. Note that the side-surface extraction electrode 6B continues to the input/output electrode 7B arranged on the lower surface of the substrate 10. Therefore, the extraction electrode 8B connects the resonator including the main-surface line 2E to the input/output electrode 7B through the side-surface extraction electrode 6B in a tap-coupling manner.

As described above, the microstripline filter 1 constitutes a filter including the resonators in the five stages. The microstripline filter 1 corresponds to a bandpass filter and has two low-pass-band attenuation poles and two high-pass-band attenuation poles.

Figure 3:
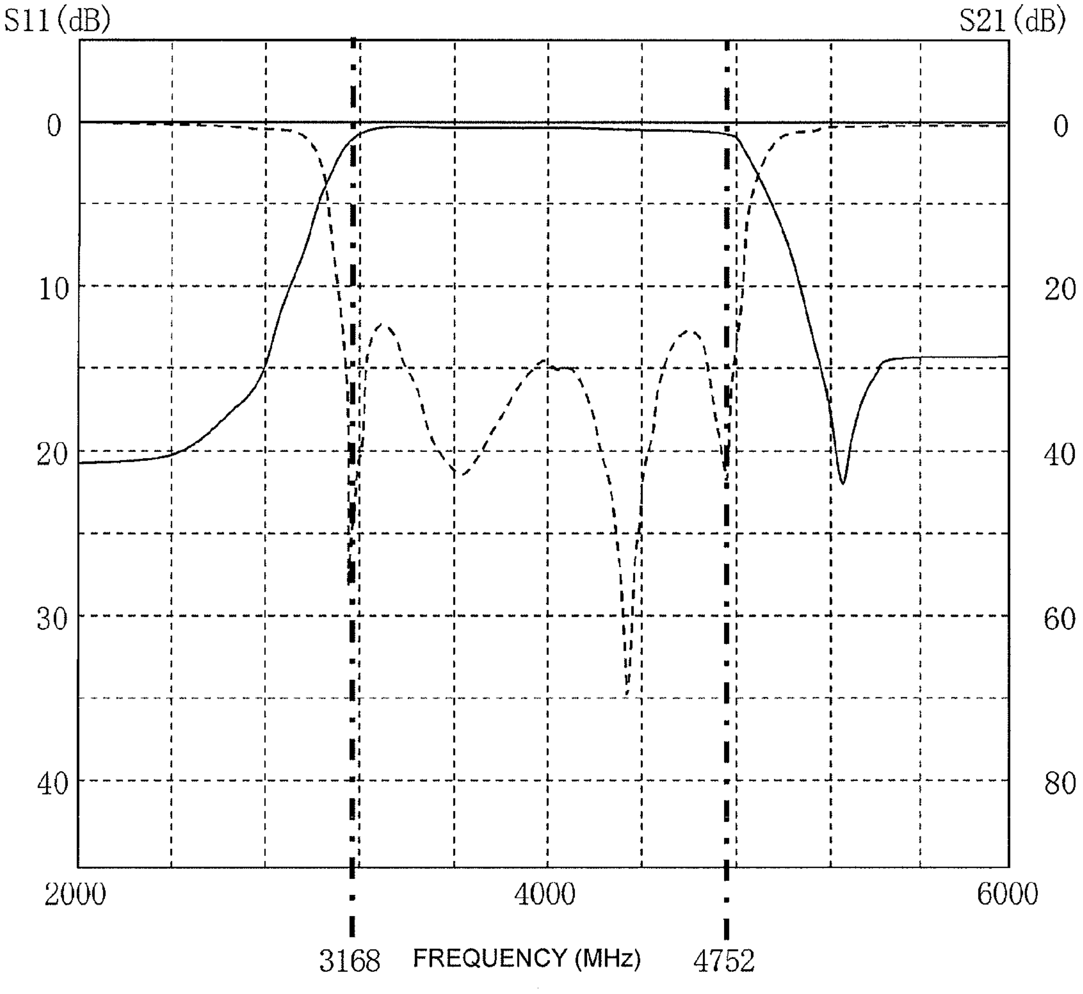
FIG. 3 is a graph illustrating an example of a frequency characteristic of the microstripline filter.

FIG. 3 shows the frequency characteristic of the microstripline filter 1. Here, an example of the characteristic in which frequencies of the two low-pass-band attenuation poles are matched with each other, and frequencies of the two high-pass-band attenuation poles are matched with each other. A dashed line of FIG. 3 denotes an S11 characteristic of the microstripline filter 1. A solid line of FIG. 3 denotes an S21 characteristic of the microstripline filter 1.

When focusing on the S21 characteristic of the microstripline filter 1, a pass band having an attenuation amount of −1.5 dB is realized in a range from 3168 MHz to 4752 MHz in the microstripline filter 1. Furthermore, an attenuation pole is positioned around in a range from approximately 2400 MHz to approximately 2500 MHz which is a lower side of the pass band, and an attenuation amount is approximately −39 dB. Another attenuation pole is positioned around in a range approximately 5150 MHz to approximately MHz which is a higher side of the pass band, and an attenuation amount is −27 dB or less.

Since the microstripline filter 1 has the two side-surface short-circuit electrodes 4A and 4B for the three main-surface lines 2A to 2C, a gap between the side-surface short-circuit electrodes 4A and 4B, line widths of the side-surface short-circuit electrodes 4A and 4B, a position of the connection between the side-surface short-circuit electrode 4A and the common electrode 3A, and a position of the connection between the side-surface short-circuit electrode 4B and the common electrode 3B affect resonant frequencies and coupling coefficients between the main-surface lines 2A to 2C.

Specifically, as the gap between the side-surface short-circuit electrodes 4A and 4B becomes larger, the coupling coefficient between the resonators including the respective main-surface lines 2A and 2B and the coupling coefficient between the resonators including the respective main-surface lines 2A and 2C become larger. In addition, resonant frequencies of the resonators including the respective main-surface lines 2A to 2C become higher. On the other hand, as the gap between the side-surface short-circuit electrodes 4A and 4B becomes smaller, the coupling coefficient between the resonators including the respective main-surface lines 2A and 2B and the coupling coefficient between the resonators including the respective main-surface lines 2A and 2C become smaller. In addition, the resonant frequencies of the resonators including the respective main-surface lines 2A to 2C become lower.

Furthermore, as the line widths of the side-surface short-circuit electrodes 4A and 4B become larger, the coupling coefficient between the resonators including the respective main-surface lines 2A and 2B and the coupling coefficient between the resonators including the respective main-surface lines 2A and 2C become larger. In addition, the resonant frequencies of the resonators including the respective main-surface lines 2A to 2C become higher. On the other hand, as the line widths of the side-surface short-circuit electrodes 4A and 4B become smaller, the coupling coefficient between the resonators including the respective main-surface lines 2A and 2B and the coupling coefficient between the resonators including the respective main-surface lines 2A and 2C become smaller. In addition, the resonant frequencies of the resonators including the respective main-surface lines 2A to 2C become lower.

Accordingly, by setting a electrode pattern including the side-surface short-circuit electrodes 4A and 4B, the resonant frequencies and the coupling coefficients among the main-surface lines 2A to 2C which are connected to one another in a conduction state through the common electrodes 3A and 3B can be controlled. In addition, the coupling coefficients and the resonant frequencies are less affected when compared with a case where shapes of the common electrodes and the main-surface lines are changed. Accordingly, it is recognized that the resonant frequencies of the resonators and the coupling coefficients between the resonators can be precisely controlled.

A method for manufacturing the microstripline filter 1 will now be described.

Figure 4:
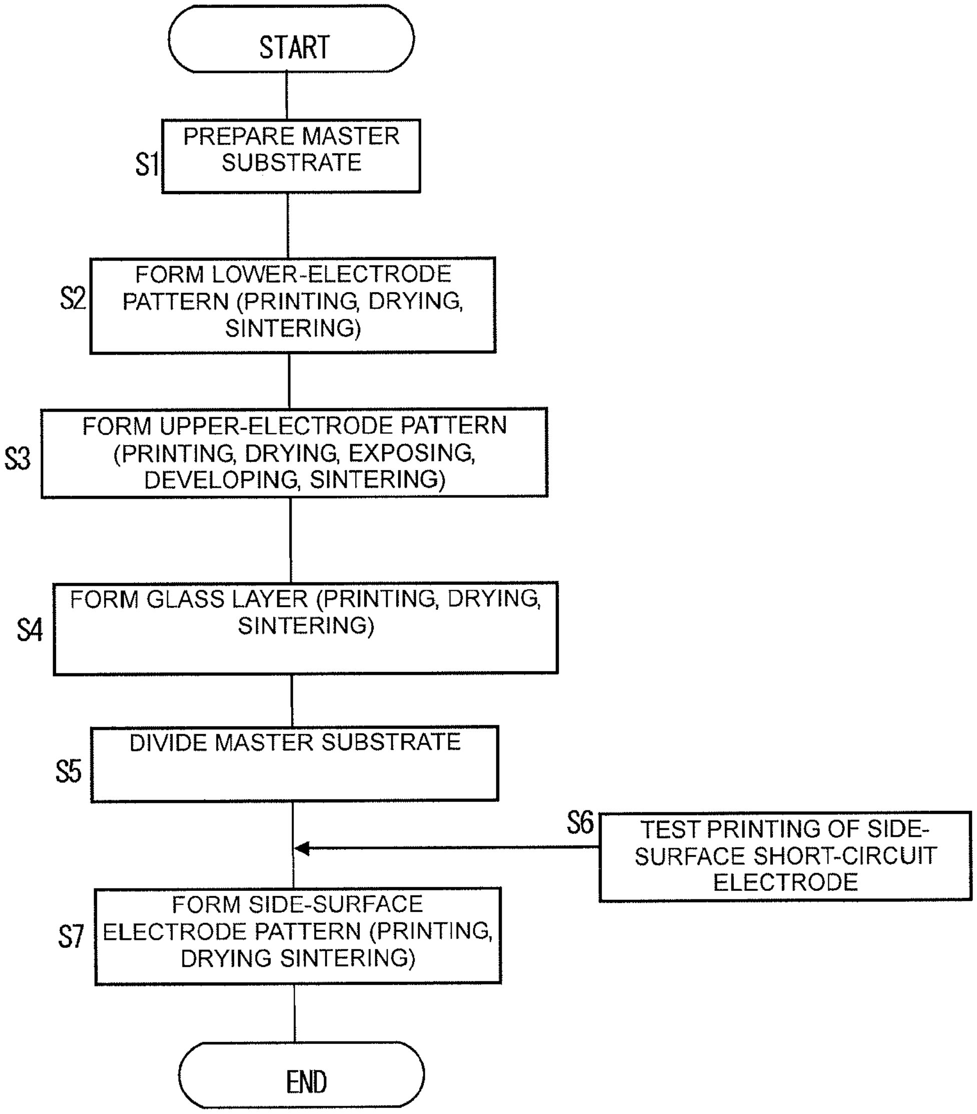
FIG. 4 is a flowchart illustrating examples of steps of manufacturing the microstripline filter.

FIG. 4 is a flowchart illustrating the method of manufacturing the microstripline filter 1.

In steps of manufacturing the microstripline filter 1, (S1) a dielectric body in which no electrode is formed on surfaces thereof is prepared as a master substrate.

(S2) Then, the master substrate is subjected to screen printing using a conductive paste on the lower surface thereof, and further subjected to drying and sintering so that a ground electrode and input/output electrodes are formed.

(S3) The master substrate is subjected to printing using a photosensitive conductive paste on the upper surface thereof, subjected to photolithography processing including drying, exposing, and developing, and further subjected to sintering so that a main-surface electrode pattern is formed.

(S4) The master substrate is subjected to printing using a glass paste on the upper surface thereof, and subjected to sintering so that a glass layer is formed.

(S5) A plurality of dielectric substrates are cut out of the master substrate configured as described above by dicing, for example. After the cutting out, preliminary measurements of electric characteristics are performed on electrode patterns arranged on upper surfaces of some of the dielectric substrates.

(S6) One or a small number of dielectric substrates are extracted from the plurality of dielectric substrates which have been cut out, side-surface short-circuit electrodes are formed as a test, and electrode patterns suitable for the side-surface short-circuit electrodes which are optimized so that a desired filter characteristic is obtained are selected.

(S7) After the side-surface short-circuit electrodes are formed on the extracted dielectric substrates as the test and the electrode patterns suitable for obtaining the desired filter characteristic are selected, a conductive paste is printed with optimized intervals on side surfaces of the plurality of dielectric substrates having an identical substrate lot, and the plurality of dielectric substrates are subjected to sintering so that the side-surface short-circuit electrodes are formed.

With the manufacturing method described above, after the main-surface electrode pattern is formed on the upper surface of the dielectric substrate, a filter characteristic can be controlled through the formation of the side-surface short-circuit electrodes on the side surfaces, and accordingly, a desired filter characteristic is reliably obtained.

Note that in the test formation of step S6, the following process may be performed: first, electrodes are also formed on gaps among the side-surface short-circuit electrodes and then the filter characteristic is measured; the filter characteristic is measured for different widths of the gaps while the widths of the gaps are gradually increased by cutting, for example; sizes of the gaps in which a desired filter characteristic is obtained are obtained; and in the next step, i.e., a main formation step, the side-surface short-circuit electrodes are formed with the gap having the selected sizes.

The electrode pattern arranged on the upper surface of the dielectric substrate 10 may considerably affect a frequency characteristic of the microstripline filter in accordance with degree of accuracy of a shape thereof, and therefore, accuracy of the electrodes are improved by photolithography processing for the formation.

Figure 5:
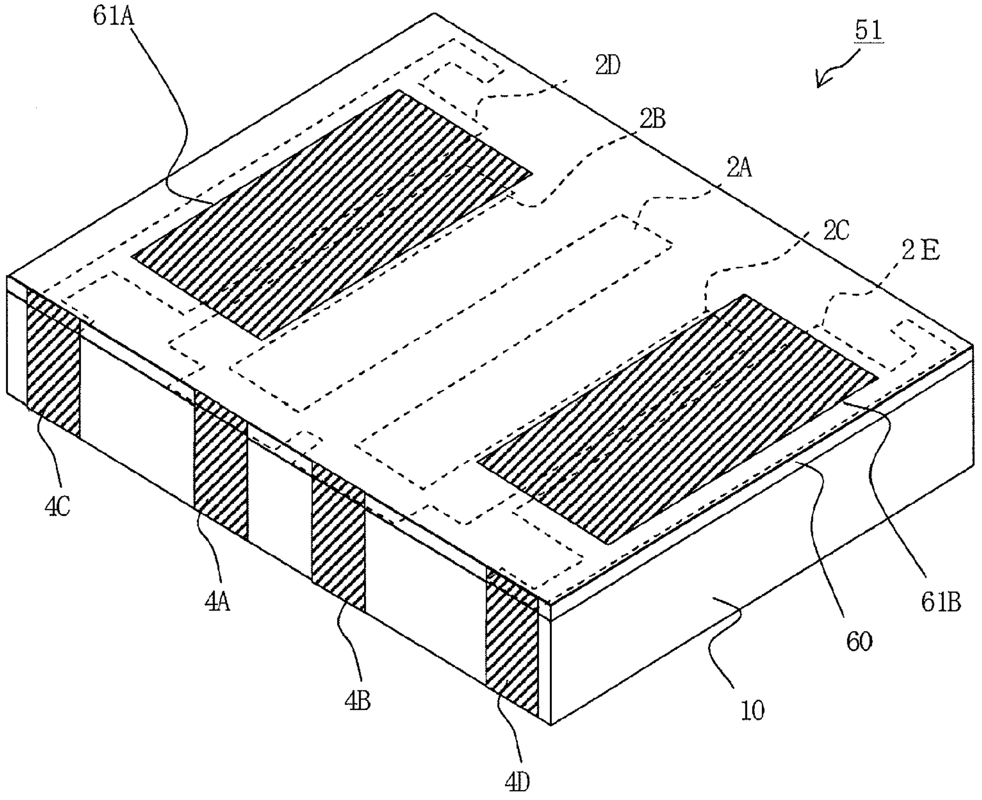
FIG. 5 is a perspective view illustrating an example of another configuration of the microstripline filter.

Next, an example of another configuration of the microstripline filter will be described. FIG. 5 is a perspective view illustrating the microstripline filter. A microstripline filter 51 is configured substantially similarly to the microstripline filter 1 described above, but is different from the microstripline filter 1 in that the microstripline filter 51 further includes coupling electrodes 61A and 61B on an upper surface of a glass layer 60. In a description below, the reference numerals that are the same as those of the microstripline filter 1 are used for components substantially the same as those of the microstripline filter 1, and therefore, detailed descriptions thereof are omitted.

The coupling electrode 61A is arranged so as to face a main-surface line 2D included in a resonator in an input stage (output stage) and a main-surface line 2B included in a resonator in a second stage through the glass layer 60. The coupling electrode 61A is arranged so as to enhance capacity coupling between the resonator in the input stage (output stage) and the resonator in the second stage. On the other hand, the coupling electrode 61B is arranged so as to face a main-surface line 2E included in a resonator in an output stage (input stage) and a main-surface line 2C included in a resonator in a fourth stage through the glass layer 60. The coupling electrode 61B is arranged so as to enhance capacity coupling between the resonator in the output stage (input stage) and the resonator in the fourth stage.

The microstripline filter may be configured as described above.

Although the microstripline filter 1 has the configuration in which side-surface electrodes other than the side-surface extraction electrodes 6A and 6B are not arranged on the rear surface of the dielectric substrate 10, other side-surface electrodes may be arranged. For example, on the rear surface of the dielectric substrate 10, side-surface electrodes may be formed congruent to the side-surface short-circuit electrodes 4A to 4D. In this case, it is not necessary to separately print the side-surface electrodes on the front surface and the rear surface. Accordingly, the side-surface electrodes can be printed without totally aligning directions of the dielectric substrates. Therefore, the printing step can be simplified.

Note that the arrangement positions and shapes of the main-surface lines and the side-surface electrodes are determined in accordance with product specifications, and any positions and shapes may be employed as long as the positions and the shapes are determined in accordance with the product specifications. This invention may be employed in configurations other than those described above, and is applicable to various pattern shapes of a filter element. In addition, another configuration (high-frequency circuit) may be included in the filter element.

The invention claimed is:

1. A microstripline filter comprising:

a dielectric substrate;

a ground electrode arranged on a lower surface of the dielectric substrate;

a plurality of main-surface lines arranged on an upper surface of the dielectric substrate to form respective resonators;

common electrodes connecting some of the plurality of main-surface lines to one another in a conduction state;

a plurality of short-circuit electrodes connecting a group of the plurality of main-surface lines which are in the conduction state to the ground electrode via an identical side surface of the dielectric substrate; and input-and-output electrodes connected to a corresponding one of the respective resonators.

2. The microstripline filter according to claim 1, wherein the plurality of short-circuit electrodes are individually arranged on portions of the common electrodes where adjacent pairs of the plurality of main-surface lines are connected to each other.

3. The microstripline filter according to claim 2, wherein a number of the plurality of main-surface lines connected to the common electrodes is three and a number of the short-circuit electrodes connected to the common electrodes is two.

4. The microstripline filter according to claim 1, wherein a thickness of the plurality of short-circuit electrodes is larger than a thickness of the plurality of main-surface lines.

5. The microstripline filter according to claim 1, further comprising a glass layer on the upper surface of the dielectric substrate.

6. The microstripline filter according to claim 5, further comprising coupling electrodes on an upper surface of the glass layer.

7. The microstripline filter according to claim 1, wherein the plurality of main-surface lines form at least an input stage resonator and an output stage resonator.

8. A method for manufacturing the microstripline filter according to claim 1, the method comprising:

providing a dielectric master substrate that includes the ground electrode and the input-and-output electrodes on a rear-main surface thereof;

forming the plurality of main-surface lines and the common electrodes on an upper-main surface of the dielectric master substrate;

dividing the dielectric master substrate into a one of the plurality of dielectric substrates, wherein one of the plurality of dielectric substrates comprises the dielectric substrate that includes the ground electrode and the input-and-output electrodes on the lower surface; and forming the plurality of short-circuit electrodes on respective side surfaces of the one of the plurality of dielectric substrates so as to extend from the common electrodes to the ground electrode.

9. The method for manufacturing the microstripline filter according to claim 8, wherein the plurality of short-circuit electrodes are formed by printing a conductive paste on the respective side-surfaces of the one of the plurality of dielectric substrates, and drying and sintering the conductive paste.

10. The method for manufacturing the microstripline filter according to claim 8, further comprising:

selecting a group of dielectric substrates from among the plurality of dielectric substrates;

forming an additional plurality of short-circuit electrodes on the respective side-surfaces of the group of dielectric substrates;

optimizing sizes of gaps between the additional plurality of short-circuit electrodes on the respective side-surfaces of the group of dielectric substrates, and thereafter, forming a second additional plurality of short-circuit electrodes on a remaining number of the plurality of dielectric substrates with the optimized size gaps.

* * * * *